United States Patent
Ramappa

(10) Patent No.: US 8,603,900 B2
(45) Date of Patent: Dec. 10, 2013

(54) REDUCING SURFACE RECOMBINATION AND ENHANCING LIGHT TRAPPING IN SOLAR CELLS

(75) Inventor: Deepak Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/911,029

(22) Filed: Oct. 25, 2010

(65) Prior Publication Data

US 2011/0097840 A1    Apr. 28, 2011

Related U.S. Application Data

(60) Provisional application No. 61/255,263, filed on Oct. 27, 2009.

(51) Int. Cl.
*H01L 21/425* (2006.01)
*H01L 21/00* (2006.01)
*H01L 21/38* (2006.01)
*H01L 21/469* (2006.01)

(52) U.S. Cl.
USPC ........... 438/514; 438/480; 438/530; 438/560; 438/784

(58) Field of Classification Search
USPC ........... 438/87, 71, 97, 527, 98, 72, 68, 785, 438/78, 79, 480, 514, 530, 560, 784; 257/E21.346, E31.124, E31.047, 257/E31.032, E21.088, E29.309, E21.043; 136/244, 252, 256
See application file for complete search history.

(56) References Cited

U.S. PATENT DOCUMENTS

| | | | |
|---|---|---|---|
| 4,253,881 A | | 3/1981 | Hezel |
| 4,542,298 A | * | 9/1985 | Holden ................. 250/443.1 |
| 4,608,452 A | * | 8/1986 | Weinberg et al. ........... 136/261 |
| 4,791,005 A | | 12/1988 | Becker et al. |
| 5,022,956 A | * | 6/1991 | Cziep et al. ............... 216/18 |

(Continued)

FOREIGN PATENT DOCUMENTS

| | | |
|---|---|---|
| DE | 102008005398 A1 | 7/2009 |
| JP | 2060172 A | 2/1990 |
| WO | 2009032359 A2 | 3/2009 |
| WO | 2011035268 A2 | 3/2011 |

OTHER PUBLICATIONS

Ken Coates et al., "Deposition of Silicon Nitride to Improve Conversion Efficiency of Multicrystalline Silicon Solar Cells," Proc. of 16th European Photovoltaic Solar Energy Conf., 2000, pp. 1279-1281.

(Continued)

*Primary Examiner* — Walter H Swanson
*Assistant Examiner* — Wilner Jean Baptiste

(57) ABSTRACT

Methods of improving the anti-reflection properties of one or more dielectric layers and reducing surface recombination of generated carriers of a solar cell are disclosed. In some embodiments, dopants are introduced into the dielectric layers to improve their anti-reflection properties. In other embodiments, species are introduced into the dielectric layers to create electrical fields which repel the minority carriers away from the surface and toward the contacts. In another embodiment, mobiles species are introduced to the anti-reflective coating, which cause carrier to be repelled from the surface of the solar cell. By creating a barrier at the surface of the solar cell, undesired recombination at the surface may be reduced.

10 Claims, 8 Drawing Sheets

(56) References Cited

U.S. PATENT DOCUMENTS

| | | | |
|---|---|---|---|
| 5,468,652 A * | 11/1995 | Gee | 438/98 |
| 6,998,288 B1 | 2/2006 | Smith et al. | |
| 7,135,350 B1 | 11/2006 | Smith et al. | |
| 7,704,352 B2 * | 4/2010 | Lopatin et al. | 204/198 |
| 7,964,431 B2 * | 6/2011 | Petti et al. | 438/68 |
| 2003/0042542 A1 * | 3/2003 | Maegawa et al. | 257/347 |
| 2005/0172996 A1 * | 8/2005 | Hacke et al. | 136/256 |
| 2008/0254203 A1 * | 10/2008 | Zhou et al. | 427/74 |
| 2008/0308892 A1 * | 12/2008 | Wildpanner et al. | 257/453 |
| 2009/0007965 A1 * | 1/2009 | Rohatgi et al. | 136/258 |
| 2009/0056800 A1 | 3/2009 | Ulyashin et al. | |
| 2009/0227095 A1 | 9/2009 | Bateman et al. | |
| 2009/0229658 A1 * | 9/2009 | Stan et al. | 136/255 |
| 2009/0288704 A1 * | 11/2009 | Borden | 136/255 |
| 2010/0098902 A1 * | 4/2010 | Kotov et al. | 428/105 |
| 2010/0154870 A1 * | 6/2010 | Bateman et al. | 136/252 |
| 2010/0184250 A1 * | 7/2010 | Blake et al. | 438/72 |
| 2010/0197126 A1 * | 8/2010 | Bateman et al. | 438/527 |
| 2010/0224240 A1 | 9/2010 | Bateman et al. | |
| 2011/0059571 A1 * | 3/2011 | De Ceuster et al. | 438/71 |

OTHER PUBLICATIONS

P. Mazzoldi, "Production of Antireflective Coatings by Ion Implantation," Proc. of the SPIE, vol. 400, 1983, abstract.

G. Sixt & A. Goetzberger, "Control of Positive Surface Charge in Si-SiO2 Interfaces by Use of Implanted Cs Ions," Applied Physics Letters, vol. 19, No. 11, Dec. 1, 1971, pp. 478-479.

Jan Benick et al., "High Efficiency N-Type Si Solar Cells on Al2O3-passivated Boron Emitters," Applied Physics Letters, vol. 92, No. 253504, 2008, pp. 1-3.

Benick, Jan, et al., Surface Passivation Schemes for High-Efficiency n-type Si Solar Cells, Phys. Stat. Sol. (RRL), Jul. 7, 2008, pp. 145-147, vol. 2, No. 4, Wiley-VCH Verlag GmbH.

\* cited by examiner

REDUCING SURFACE RECOMBINATION AND ENHANCING LIGHT TRAPPING IN SOLAR CELLS

This application claims priority of U.S. Provisional Patent Application Ser. No. 61/255,263, filed Oct. 27, 2009, the disclosure of which is incorporated herein by reference in its entirety.

FIELD

This invention relates to dielectrics in a solar cell and, more particularly, to methods that enhance optical properties of a dielectric layer of a solar cell.

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Solar cells typically consist of a p-n semiconducting junction. FIG. 1 is a cross-sectional view of a selective emitter solar cell. It may increase efficiency (e.g. percentage of power converted and collected when a solar cell is connected to an electrical circuit) of a solar cell 210 to dope the emitter 200 and provide additional dopant to the regions 201 under the contacts 202. More heavily doping the regions 201 improves conductivity and having less doping between the contacts 202 improves charge collection. The contacts 202 may be spaced approximately 2-3 mm apart. The regions 201 may only be approximately 100-300 μm across. FIG. 2 is a cross-sectional view of an interdigitated back contact (IBC) solar cell 220. In the IBC solar cell, the junction is on the back of the solar cell 220. The doping pattern is alternating p-type and n-type dopant regions in this particular embodiment. The p+ emitter 203 and the n+ back surface field 204 may be doped. This doping may enable the junction in the IBC solar cell to function or have increased efficiency.

Both the selective emitter solar cell of FIG. 1 and the IBC solar cell of FIG. 2 have an anti-reflective coating (ARC) 205. This ARC 205 may be, for example, $Si_xN_y$. To improve the light capture of the ARC layer 205, the $Si_xN_y$ layer may have an oxide film 206 underneath. The oxide film 206 may have a higher refractive index than silicon. The $Si_xN_y$ ARC 205 may have a higher refractive index than the oxide 206 and further refracts light back into the silicon of the solar cell. This type of refraction reduces the amount of reflected light and increases cell efficiency.

Use of an oxide layer 206 with an ARC 205 has drawbacks. Carrier recombination occurs at the surface interfaces, such as at the dangling bonds between the silicon and the dielectric layers (i.e. the ARC 205 and oxide layers 206). Furthermore, the light trapping is not optimal and the dielectric layers, such as the nitride or oxide layer, absorb UV light. This reduces UV collection efficiency of the solar cell. Accordingly, there is a need in the art for improved methods that enhance optical properties of a dielectric layer of a solar cell.

SUMMARY

Methods of improving the anti-reflection properties of one or more dielectric layers and reducing surface recombination of generated carriers of a solar cell are disclosed. In some embodiments, dopants are introduced into the dielectric layers to improve their anti-reflection properties. In other embodiments, species are introduced into the dielectric layers to create electrical fields which repel the minority carriers away from the surface and toward the contacts. In another embodiment, mobiles species are introduced to the anti-reflective coating, which cause carrier to be repelled from the surface of the solar cell. By creating a barrier at the surface of the solar cell, undesired recombination at the surface may be reduced.

BRIEF DESCRIPTION OF THE DRAWINGS

For a better understanding of the present disclosure, reference is made to the accompanying drawings, which are incorporated herein by reference and in which.

DETAILED DESCRIPTION

Embodiments of this system are described herein in connection with solar cells. However, the embodiments of this method can be used with, for example, semiconductor substrates, image sensors, or flat panels. Embodiments of this method may be used with, for example, either a beam-line or plasma doping type ion implanter. Thus, the invention is not limited to the specific embodiments described below.

To improve the use of an oxide layer 206 with an ARC 205, an optimized surface field effect may keep minority carriers off the surface or away from the dielectric layers and enhance collection at the contacts. This may prevent or reduce carrier recombination at the surface interfaces. Optimizing the oxide 206 and ARC 205 layers can enhance light trapping. Reducing the thickness of the dielectric layer, such as the oxide or nitride, will reduce the amount of UV light absorbed by these layers. Embodiments of the methods described herein improve anti-reflection properties or light collection efficiency and reduce surface recombination of generated carriers. This may improve the overall efficiency of the solar cell. This may be done by improving the refractive index of surface layers or by developing an electric field at the surface of the solar cell.

According to a first method, the surface passivation layer may be doped to improve the solar cell. In some embodiments, the surface passivation layer and the anti-reflective coating 205 may be the same. In other embodiments, the surface passivation layer may be an oxide layer 206, with an anti-reflective coating 205 applied on top of it.

Figure 3:
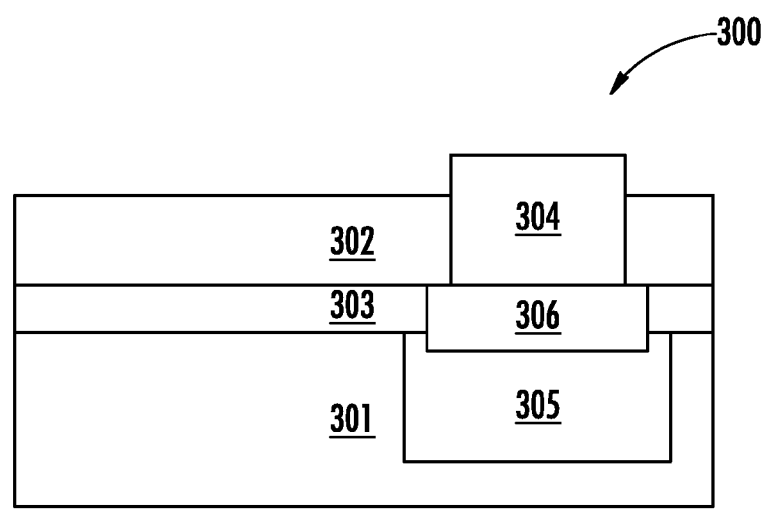
FIG. 3 is a cross-sectional view of part of an exemplary solar cell.

This surface passivation layer, which may be an oxide, nitride, oxy-nitride, or amorphous silicon ($\alpha$-Si), is doped during or after its formation. This doping increases the refractive index of the layer and enhances total internal reflection. FIG. 3 is a cross-sectional view of part of an exemplary solar cell. While this particular solar cell design is disclosed, embodiments of this method may be applied to other solar cell designs, such as those with a p-doped emitter. The n-type emitter 301 in the solar cell 300 may be disposed on a p-type substrate (not illustrated) to form a junction. The oxide layer 303, which serves as the surface passivation layer, is located between the n-type emitter 301 and the ARC 302. The ARC 302 may be, for example, $\alpha$-Si, $Al_2O_3$, another material with the formula $Al_xO_y$, $Si_3N_4$, SiN, or another material with the formula $Si_xN_y$, indium tin oxide or another materials with the formula $(In_xSn_yO_z)$, or $SnO_2$ or $TiO_2$ or any dielectric that is used as an antireflective coating. Recombination occurs at the interfaces between the n-type emitter 301 and the oxide layer 303 and between the oxide layer 303 and the ARC 302, causing a loss in efficiency of the solar cell 300. The contact 304, which may be metal, contacts the n++ doped region 305 through the ohmic contact 306. The ohmic contact 306 can be created by a firing process. Paste is introduced to the surface of the solar cell and is heated to cause it to diffuse into the solar cell. In fired contacts, the silver in the paste forms a silicide, which usually forms the ohmic contact 306. Use of the ohmic contact 306 leads to high recombination and high collection efficiency.

In a first method, the substrate is doped prior to oxidation. Dopants such as B, Al, Ga, In, or Tl may be implanted into the silicon of the n-type emitter 301, possibly with an ultrashallow implant. Lighter species may be more effective for this method, although the other species may be used. Using an implant energy of less than approximately 5 keV, the implant depth may be less than approximately 10% of the depth of the emitter. This is one example of an ultrashallow implant, though other depths are possible. During the oxidation to form the oxide layer 303, the dopant, which has a negative segregation coefficient, will segregate from the emitter 301 to within the oxide layer 303. The dose of these species may be chosen based on the amount of dopant needed in the oxide. Most of the dopants tend to segregate preferentially into the oxide during its growth. This concentration is dependent on the solubility of these dopants in the grown oxide. Preferably, up to 0.1 to 1% dopant is needed in the grown oxide, which may require a $10^{14}$ to $5\times10^{15}$ cm$^{-3}$ initial implanted dose depending on the dopant used.

For example, in one particular embodiment, during oxidation to form the oxide layer 303, boron, previously implanted in the n-type emitter 301, preferentially segregates into the oxide layer 303. The segregation may occur because the B solubility in an oxide is higher than in Si, but other mechanisms are possible. This implant is performed following any other doping processes, such as those required for any emitter or surface field. This segregation of dopants from the emitter 301 to the oxide layer 303 will increase the refractive index of the oxide layer 303.

Figure 4:
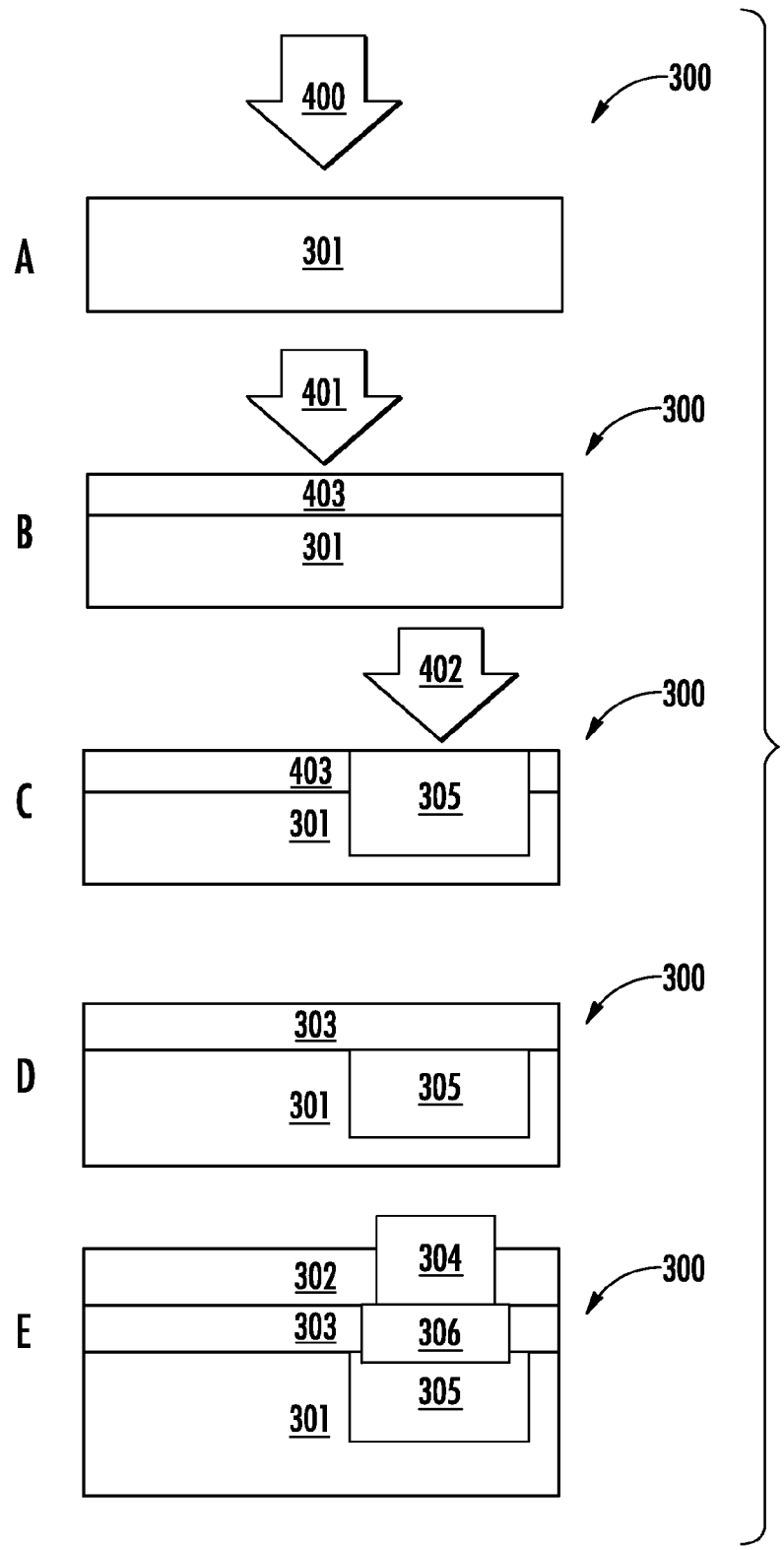
FIGS. 4A-E are an embodiment of fabricating a solar cell using the first method disclosed herein.

FIGS. 4A-E are an embodiment of fabricating a solar cell using the first method disclosed herein. In FIG. 4A, n-type doping occurs using the implant 400. This will form the n-emitter 301 with a dopant concentration of approximately 1E20 cm$^{-3}$. In FIG. 4B, a p-type doping occurs using the implant 401. This may be an ultrashallow implant using, for example, B$^+$ that forms the implanted layer 403 with a dopant concentration of approximately 1E18 cm$^{-3}$. For example, the implanted layer may be a thickness which is about ⅓ the thickness of the oxide grown. In FIG. 4C, the n++ doped layer 305 is formed using the implant 402. The implant 402 may be performed using, for example, a mask with apertures. This n++ doped layer is used to allow better carrier collection. In FIG. 4D, an oxidation and anneal process is used to form the oxide layer 303. The dopant from the implanted layer 403 moves from or segregates to the oxide layer 303 and dopes the oxide layer 303 to a concentration greater than approximately 1E19 cm$^{-3}$. In FIG. 4E, metallization occurs to form the contact 304 and ohmic contact 306. The ARC 302 is then deposited around the contact 304.

The implant 401 may be performed by a plasma doping, plasma immersion, or beam-line ion implanter. The plasma doping system may give an improved surface peak profile rather than a non-retrograde profile because it is predominantly surface source diffusion driven. Dopant doses for the implant 401 in one instance are between approximately 1E13 to 7E15 cm$^{-2}$. This implant 401 also may be performed in a cluster configuration that includes pre-treatments or post-treatments in a sequence.

Figure 5:
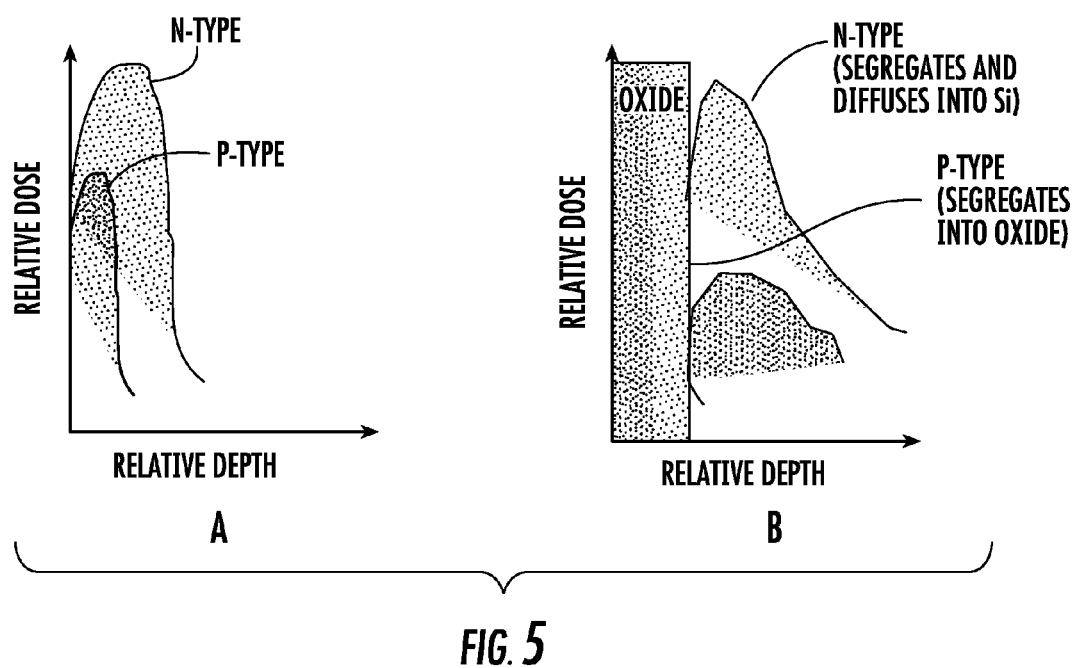
FIGS. 5A-B are as-implanted and post-oxidation profiles for p-type and n-type dopants.

FIGS. 5A-B are as-implanted and post-oxidation profiles for p-type and n-type dopants. FIGS. 5A-B illustrate a solar cell with an n-type emitter. The n-type curve in FIG. 5A corresponds to implant 400 of FIG. 4A, while the p-type curve corresponds to the implant 401 in FIG. 4B. The resulting profile shown in FIG. 5B corresponds to final state of the emitter after the oxidation, as shown in FIG. 4D.

As explained above, in addition to the emitter doping (implant 400 of FIG. 4A), a p-type implant (implant 401 of FIG. 4B) is performed. As shown in FIG. 5B, the p-type dopant, such as B, segregates into the oxide layer 303, though the profile of the p-type dopant may depend on the thickness of the oxide layer 303. The profile shown in FIG. 5B may be an oxide approximately 50-300 Å in thickness. This p-type implant may be an ultrashallow implant, but the depth of the p-type implant depends on the thickness of the oxide layer that will be grown during oxidation. For example, a B implant of 0.4 keV may be followed by a 50 Å growth of an oxide. In another embodiment, a BF$_2$ implant of approximately 2 keV may be followed by a 50 Å growth of oxide.

A doped oxide layer 303 has a higher refractive index than a non-doped oxide layer. The doped oxide layer 303 also has enhanced refractive properties and deflects minority carriers from the surface of the n-type emitter 301. Since the majority of the solar cell 300 surface is not covered by contacts 304, the doped oxide layer 303 helps suppress recombination of minority carriers at the interface between the n-type emitter 301 and the oxide layer 303.

In one particular embodiment, the implant 400 or implant 402 may be combined with the implant 401 to create the implanted layer 403. These combined implants may be performed in one instance through the dielectric, such as the ARC 302. In other words, referring to FIG. 4, some or all of steps 4C-E may be performed before steps 4A-B in some embodiments.

In an alternate embodiment, the emitter of the solar cell 300 may be a p-type emitter. Thus, the junction is the solar cell 300 may be reversed. For a p-type emitter, the ARC 302 may be $Al_xO_y$, such as AlO or $Al_2O_3$. An implant into or through $Al_xO_y$ using species such as H, F, B, or $BF_2$, may still improve the dielectric similar to that of nitrides.

This first method will increase the refractive index of the dielectric layers and may provide an optimized surface field effect that creates a surface accumulation layer in the solar cell 300. Thus, minority carriers may be kept off the surface of the solar cell 300 and minority carrier collection at the contact 304 may be enhanced. This will improve efficiency of the solar cell 300. Since the dielectric layer will change its refractive index when doped, the thickness of the dielectric and amount of light absorbed by the dielectric may be reduced. Reducing the thickness of the dielectric will decrease cost of ownership and manufacturing costs. Furthermore, by tuning the dopant gradient, a graded passivated layer may be formed and increased temperance to desired wavelengths of light can be achieved. Tuning or having graded refractive index may be used to control what part of the spectrum is preferentially reflected back into the emitter.

Figure 1:
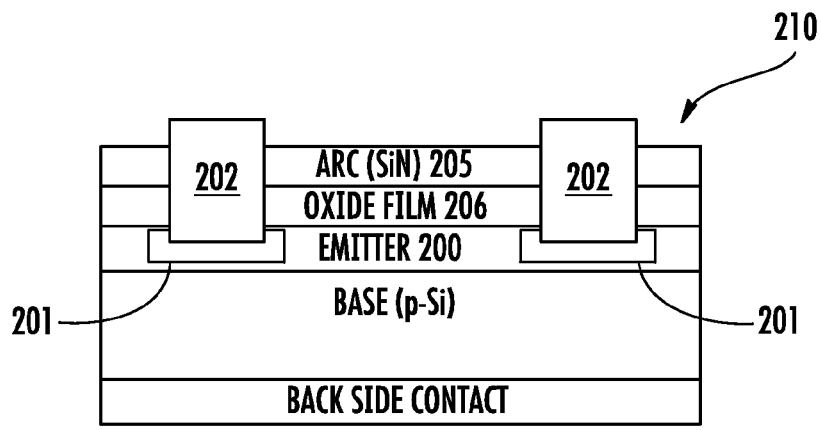
FIG. 1 is a cross-sectional view of a selective emitter solar cell.

In a second method, the dielectric layers are treated so as to create a fixed charge in the surface passivation and/or antireflection coating. This may be performed by thermal diffusion from the deposition source or by ion implantation. The surface recombination of photogenerated minority carriers is a source of efficiency loss for solar cells. Ideally, the minority carriers should drift in the field toward a contact to contribute toward the generated current. Since contacts only cover a fraction of the surface of the solar cell, the possibility of the photogenerated carriers reaching the surface and recombining in a non-contact area is fairly high. For front-side contact solar cells, such as the selective emitter solar cell of FIG. 1, the contact area is minimized to increase incoming light incidence and absorbance efficiency. Transverse or lateral fields in the solar cell may increase efficiency of the solar cell. Doping may be performed in the surface passivation or ARC to create a fixed charge and, hence, and electric field. This resulting dielectric electric field will repel carriers that are drifting toward the surface of a solar cell in an area without a contact. This helps to repel the carriers from the surface and allows them to diffuse laterally toward the contact.

Figure 6:
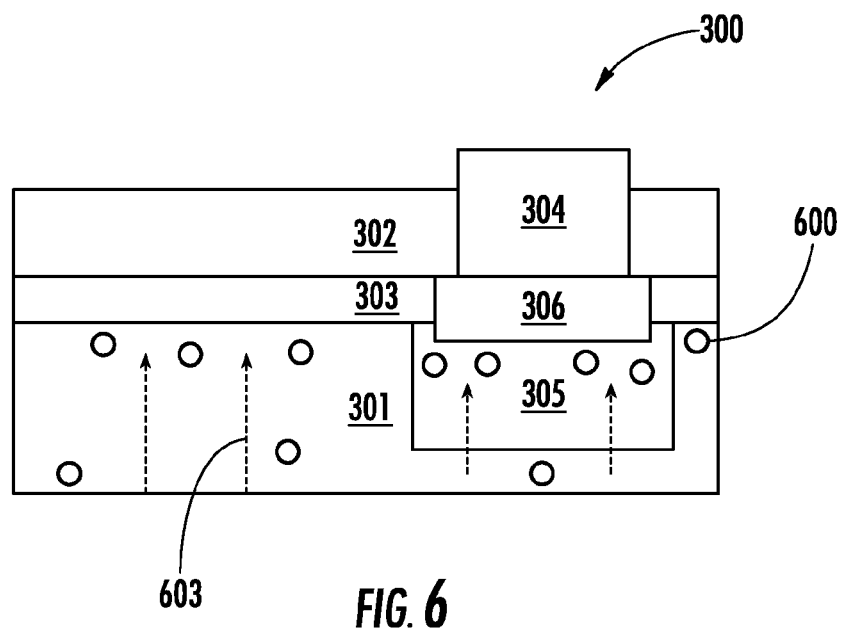
FIG. 6 is a cross-sectional view of part of an exemplary solar cell illustrating field drift of carriers.

FIG. 6 is a cross-sectional view of part of an exemplary solar cell 300 illustrating field drift of carriers. The photogenerated carriers 600 drift toward the contact 304 and the interface between the oxide layer 303 and n-type emitter 301 as illustrated by the dotted lines 603. A significant number of carriers 600 drift toward the surface of the solar cell 300 where no contact 304 is present. The total area of the contacts 304 in some instances may be less than approximately 1% of the whole surface area of the solar cell 300. Thus, the chance of a carrier 600 reaching the contact 304 to generate current is low.

Figure 7:
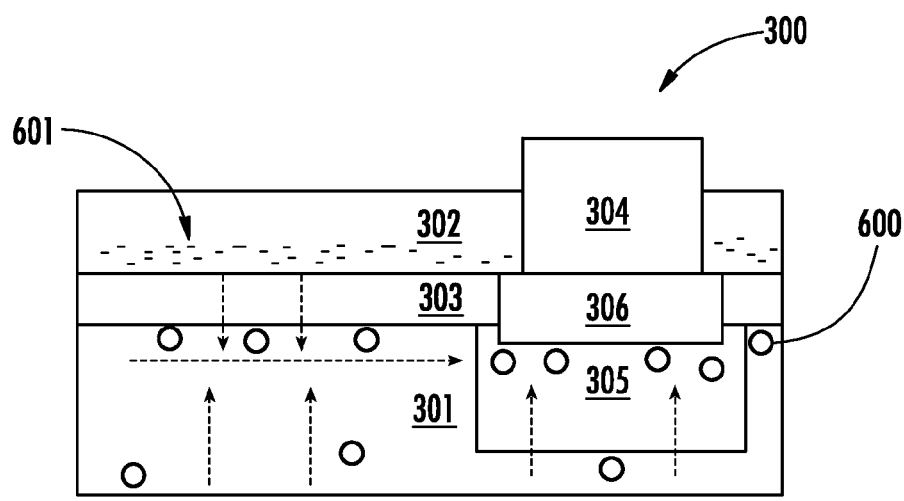
FIG. 7 is a cross-sectional view of part of an exemplary solar cell with a field using the second method disclosed herein.

FIG. 7 is a cross-sectional view of part of an exemplary solar cell 300 with a field using the second method disclosed herein. A field 601 (represented by the lines in the ARC 302) in the ARC 302 or surface passivation layer can be used to laterally or transversely drift the carriers 600 that diffuse to the surface of the solar cell 300 in a region away from the contact 304 toward contact 304. In some embodiments, a positive field 601 is created to repel positive minority carriers. In other embodiments, a negative field 601 can be created to repel negative charges. This electrical field 601 may be placed in all regions of the surface of the solar cell 300 where no contacts 304 are located. Carriers 600 will be repelled by the field 601 in the ARC 302 and back into the emitter 301. In one instance, lateral drift toward contacts 304 occurs due to a lateral doping gradient. This is because, for example, the n++ doped layer 305 under the contact 304 may be more heavily doped than the n-type emitter 301.

The field 601 may be created using various methods. For example, the field 601 may be created by doping or implanting the ARC 302. The field 601 also may be created by building a residual fixed charge during the deposition process of the ARC 302.

A positive field 601 may be formed by implanting the ARC 302 or surface passivation layer with species such as Si, C, He, Ar, Ne, Kr, Xe, or H. A negative field 601 may be formed by implanting the ARC 302 or surface passivation layer with species such as F, Cl, Br, or N. This implant may be performed in a beam-line, plasma immersion, or plasma doping ion implanter in a single wafer, batch, or cluster configuration. The energy of the implant depends on the thickness of the ARC 302 or passivation layer. When implanted, the dopants may cause vacancies that partly cause the field 601, so the implant energy should be selected to keep the dopants in the dielectric layers. The dopants may be centered in the half of the dielectric that is closest to the n-type emitter 301 or a bottom portion of the dielectric closest to the n-type emitter 301. Any dopant that trickles into the p-doped or n-doped regions of the solar cell 300 may cause defects and enhance surface recombination.

Figure 11:
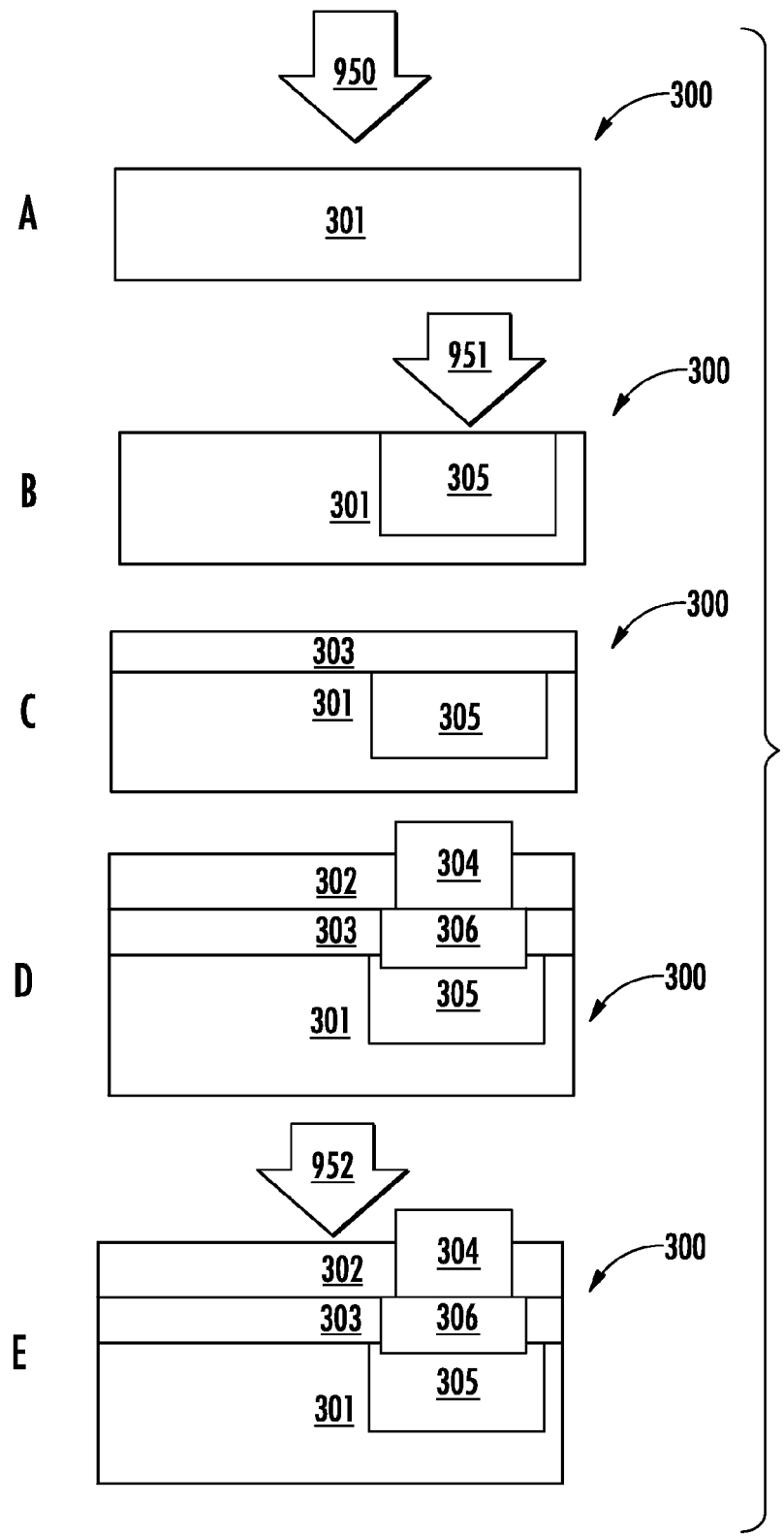
FIG. 11A-E are an embodiment of fabricating a solar cell using the second method disclosed herein.

FIG. 11A-E are an embodiment of fabricating a solar cell using the second method disclosed herein. In FIG. 11A, n-type doping occurs using the implant 950. This will form the n-emitter 301 with a dopant concentration of approximately $1E20$ $cm^{-3}$. In FIG. 11B, the n++ doped layer 305 is formed using the implant 951. The implant 951 may be performed using, for example, a mask with apertures. This n++ doped layer is used to allow better carrier collection. In FIG. 11C, an oxidation is used to form the oxide layer 303. In FIG. 11D, metallization occurs to form the contact 304 and ohmic contact 306. The ARC 302 is then deposited around the contact 304. In FIG. 11E, implant 952 is used to dope the surface passivation layer or the ARC 302, as described above.

The implant 952 may be performed by a plasma doping, plasma immersion, or beam-line ion implanter. This implant 952 also may be performed in a cluster configuration that includes pre-treatments or post-treatments in a sequence.

In addition, the implant 952 of the ARC 302 or surface passivation layer may be combined with the implants 950, 951 that are used to create the emitter or n++ doped layer. Thus, doping the junction in the solar cell 300 may be combined with changing the electric field in the dielectric in an at least partially simultaneous process. This will reduce the number of process steps and manufacturing costs. The dopant used may be either p-type or n-type.

Fixed charge fields in the ARC 302 or passivation layer also may be created during deposition of these layers. For example, during deposition of the $Si_3N_4$ in the ARC 302, the ratio of the flowing N may be reduced to cause a fixed positive charge increase. Use of additional in-situ dopants during deposition, such as B, C, Ge, O, Sn, S, or Se, also may add fixed charges to the dielectric.

This second method will repel carriers 600 to improve efficiency of the carriers 600 captured by the contact 304 and, consequently, enhance the efficiency of the solar cell 300. Deposition of additional layers, such as $Al_2O_3$, is not required to achieve these effects and, thus, manufacturing costs are decreased. Light collection efficiency may be improved by not including these unneeded additional layers. Capture of carrier efficiency contributes toward a current, so solar cell 300 efficiency and current are improved. The field 601 is created only in the regions of the dielectric without a contact 304 so this increases a barrier for recombination at the surface of the solar cell 300. Furthermore, doping in this manner does not change the properties of the ARC 302.

Figure 2:
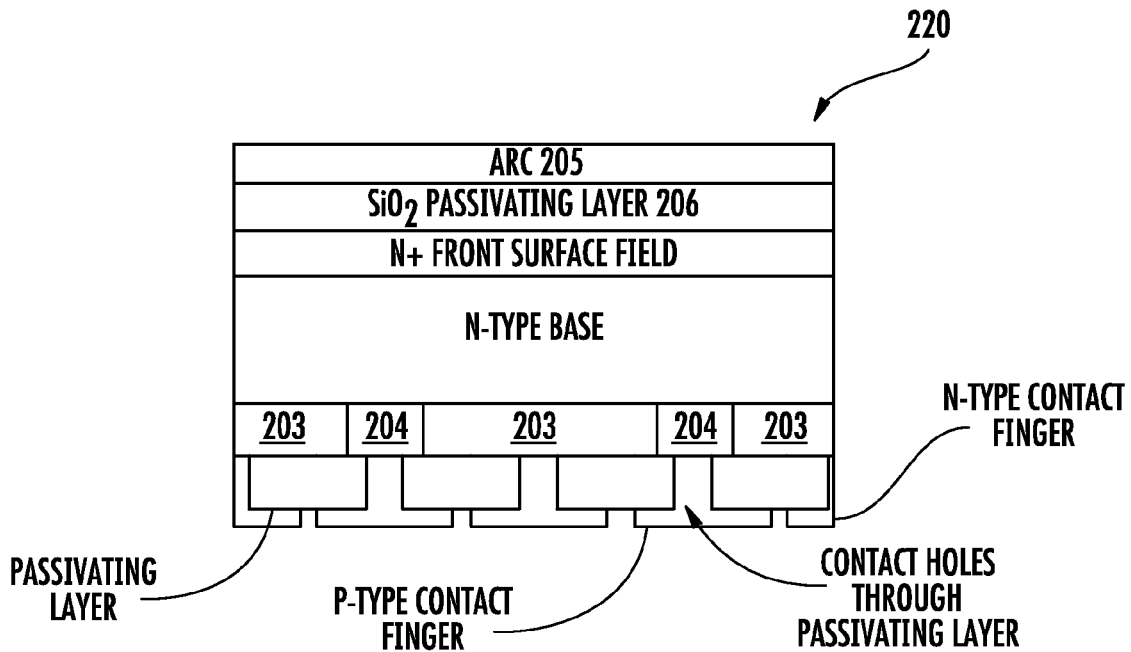
FIG. 2 is a cross-sectional view of an interdigitated back contact solar cell.

For high efficiency solar cells, there may be a need for good passivation to enable reduced surface recombination and, hence, higher solar cell efficiency. The ARC and passivation schemes for p-doped and n-doped regions may be different. The passivation interface for an n-type surface needs to be positively charged to attract and maintain a surface accumulation layer of electrons. Similarly the passivation interface for a p-type surface needs to be negatively charged to attract and maintain a surface accumulation layers of holes. Therefore, a $Si_xN_y$ ARC layer is an optimum ARC layer for n-type surfaces because it has a total positive charge in the ARC layer. $Al_2O_3$ or $\alpha$-Si, which has a negative charge, is used to passivate a p-type surface. For high efficiency cells, such as the IBC solar cell of FIG. 2, this poses an integration problem. Passivating both n-type and p-type regions in such a small space would increase processing and integration complexity.

Figure 10:
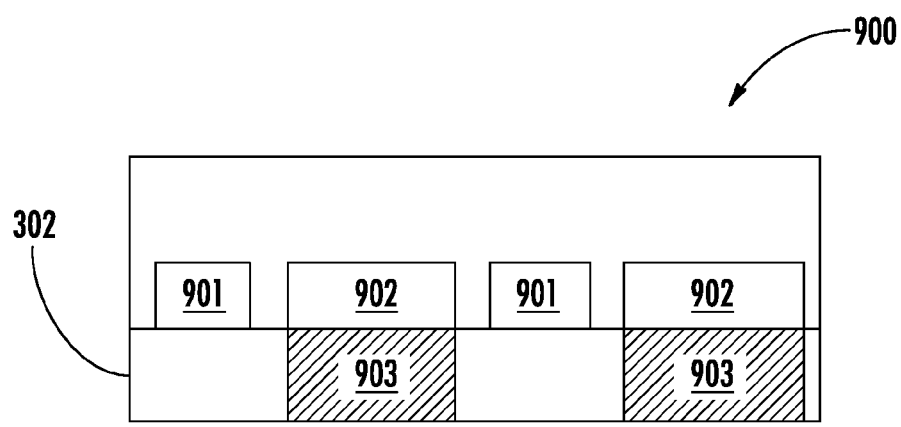
FIG. 10 is a cross-sectional view of an embodiment of an exemplary IBC solar cell.

FIG. 10 is a cross-sectional view of an embodiment of an exemplary IBC solar cell. Other designs than that illustrated in FIG. 10 are possible and embodiments disclosed herein are not limited solely to the design of FIG. 10. The IBC solar cell 900 has alternating n-type regions 901 and p-type regions 902 beneath the ARC 302. The ARC layer 302 plays a role of not only a antireflection layer but also as a passivation layer. SiN layers are used to passivate n-type surfaces and $Al_2O_3$ for p-type surfaces. Thus, this ARC is more appropriately referred to as passivation layers rather than anti-reflective coating, especially when used on the backside, as in this IBC embodiment. The ARC 302 may be a nitride in one instance, which is appropriate for the n-type region 901. In this particular embodiment, the implant to form at least the p-type regions 902 may be through the ARC 302. This may use a mask with apertures to allow implantation of the desired region or other patterning techniques such as lithography. Implanting the p-type regions 902 through the ARC 302 will create charged regions 903 in the ARC 302. These charge regions 903 in the ARC 302 will change the polarity of charge in the ARC 302 to be appropriate for the p-type region 902 because the negative charge is required to passivate the p-type region 902. Thus, the implant into the ARC 302 and the implant into the IBC solar cell 900 may be the same for at least the p-type regions 902. This method reduces the processing cost of ownership and improves integration throughput.

Alternatively, the doping of the junction and implanting into the dielectric to change the passivation properties can be accomplished in separate implants.

In a third method, a mobile species is used to create an electrical field in the dielectric layer. A mobile species, such as Na, Li, Ca, K, other Group 1A elements, or other Group 2A elements, remain ionized and move interstitially within the dielectric layers. These species also may preferentially segregate to the interface between the ARC 302 and the oxide layer 303 or the interface between the oxide layer 303 and the silicon of, for example, the n-type emitter 301. Such species may be used to create fields.

Figure 8:
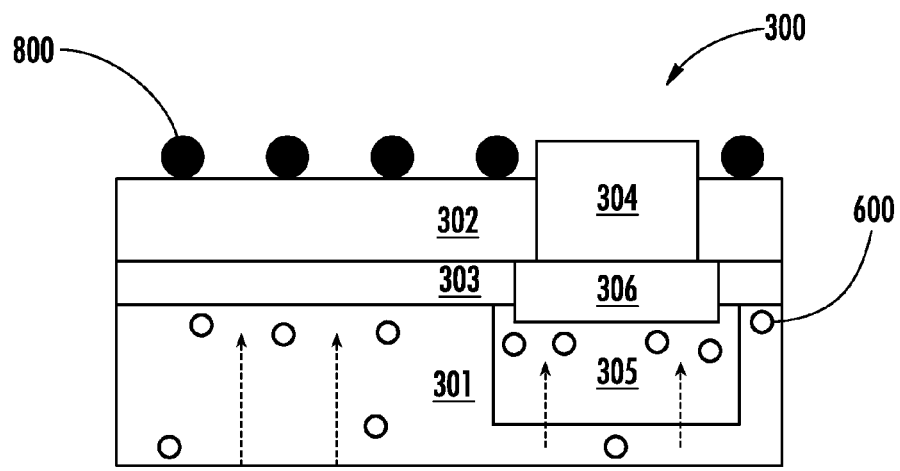
FIG. 8 is a cross-sectional view of part of an exemplary solar cell with mobile charges on the surface of the dielectric using the third method disclosed herein.

FIG. 8 is a cross-sectional view of part of an exemplary solar cell 300 with mobile charges on the surface of the dielectric layer 302 using the third method disclosed herein. The species 800, which in this particular embodiment is Na, is on the surface of the ARC 302. The solar cell 300 may be dipped in or sprayed with a NaCl solution. This will coat the surface of the nitride dielectric, such as the ARC 302, with Na atoms or ions. In an alternate method, Na may also be incorporated during the deposition of the ARC 302 or oxide layer 303.

Figure 9:
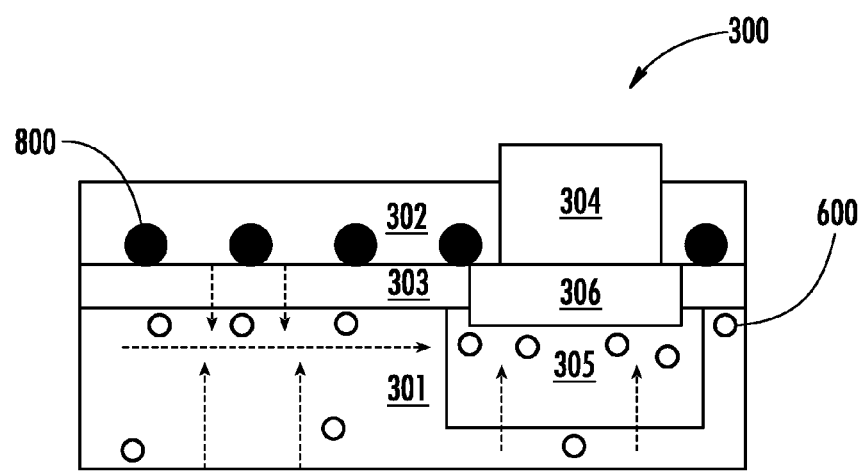
FIG. 9 is a cross-sectional view of part of an exemplary solar cell with mobile charges diffused into the dielectric using the third method disclosed herein.

FIG. 9 is a cross-sectional view of part of an exemplary solar cell with mobile charges diffused into the dielectric using the third method disclosed herein. With a thermal process, the species 800 diffuses to the interface, in this instance, between the ARC 302 and the oxide layer 303. The thermal process in one embodiment is between approximately 40° C. and 300° C., though other temperature ranges are possible. When located at this interface, the species 800 will repel carriers 600 toward the bulk of the solar cell 300. The species 800, thus, will cause a lateral or transverse drift of the carriers 600 that diffuse to the surface of the solar cell 300 in a region away from the contact 304. The species 800 will repel the carriers 600 toward the contact 304 as illustrated by the dotted lines in FIG. 9. The lateral drift may occur due to an existing lateral dopant gradient because the area under the contact 304, in this case the n++ doped layer 305, is more heavily doped than the rest of the solar cell 300.

The Na or other mobile contaminant used for species 800 may be incorporated by solute coating, but also may be incorporated during formation of the dielectric, by deposition, by vapor deposition (such as chemical vapor deposition or physical vapor deposition), by ion implantation of the species 800, or by annealing the solar cell 300 in the presence of the species 800. Since Group 1A and Group 2A elements tend to be positively ionized, these elements only repel holes at the interface. To repel electrons, negative fields are needed. A negatively-charged species 800, such as F, Cl, Br, or I, may be used in this case. Such negatively-charged species may be incorporated by solute coating, during formation of the dielectric, deposition, vapor deposition, ion implantation, or annealing the solar cell 300 in the presence of these negatively-charged species.

This third method will repel carriers 600 to improve efficiency of the carrier capture by the contact 304 and, consequently, enhance efficiency of the solar cell 300. Deposition of additional layers may be avoided, which reduces manufacturing costs. Spray or baths are relatively inexpensive processing steps. The field is created only in the regions of the dielectric without a contact 304 so this increases the barrier for recombination at the surface of the solar cell 300. Furthermore, doping in this manner does not change the properties of the ARC 302.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of improving an efficiency of a solar cell, comprising:

introducing a first species into a surface of a solar cell to create an emitter having a first conductivity;

applying a surface passivation layer to said surface; and introducing a second species into said surface passivation layer to a depth in said surface passivation layer above said emitter using at least one of ion implantation or deposition so as to create an electric field from within said surface passivation layer to repel a minority carriers in said emitter away from said surface.

2. The method of claim 1, wherein said emitter is a n-type and said second species is selected from a group consisting of Si, C, He, Ar, Ne, Kr, Xe, and H.

3. The method of claim 1, wherein said emitter is a p-type and said second species is selected from a group consisting of F, Cl, Br, and N.

4. The method of claim 1, wherein said second species is selected from the group consisting of Na, Li, Ca, K, other Group 1A elements and other Group 2A elements.

5. A method of improving an efficiency of a solar cell, comprising:

introducing a first species of dopants into a surface of a solar cell to create an emitter having a first conductivity;

applying a surface passivation layer to said surface, said surface passivation layer defining a first surface and a second surface, said second surface disposed on said surface of said solar cell and being opposite of said first surface;

applying a second species to said first surface of said surface passivation layer; and diffusing said second species in said passivation layer to a depth above said surface of said solar cell, whereby said second species creates an electric field from within said surface passivation layer to repel a minority carriers in said emitter away from said surface.

6. The method of claim 5, wherein said emitter is a n-type and said second species is selected from a group consisting of Na, Li, Ca, K, other Group 1A elements and other Group 2A elements.

7. The method of claim 5, wherein said second species is sprayed on said surface passivation layer.

8. The method of claim 5, wherein said solar cell is dipped in a solution comprising said second species.

9. The method of claim 5, wherein said second species is deposited on said surface passivation layer.

10. The method of claim 5, wherein said second species is introduced by annealing said solar cell in the presence of said second species.

* * * * *